April 12, 1966 J. O. SCHROEDER 3,246,177

ELECTRONIC SWITCHING CIRCUIT EMPLOYING AN INSULATED GATE FIELD-EFFECT TRANSISTOR HAVING RECTIFIER MEANS CONNECTED BETWEEN ITS GATE AND SOURCE OR DRAIN ELECTRODES

Filed June 19, 1963 3 Sheets-Sheet 1

INVENTOR.
JOHN O. SCHROEDER

BY Eugene M. Whitacre

Attorney

April 12, 1966

J. O. SCHROEDER 3,246,177

ELECTRONIC SWITCHING CIRCUIT EMPLOYING AN INSULATED GATE FIELD-EFFECT TRANSISTOR HAVING RECTIFIER MEANS CONNECTED BETWEEN ITS GATE AND SOURCE OR DRAIN ELECTRODES

Filed June 19, 1963

3 Sheets-Sheet 2

INVENTOR.
JOHN O. SCHROEDER
BY
Eugene M. Whitacre
Attorney

INVENTOR.
JOHN O. SCHROEDER
BY Eugene M. Whitacre
Attorney 3,246,177

ELECTRONIC SWITCHING CIRCUIT EMPLOYING AN INSULATED GATE FIELD-EFFECT TRANSISTOR HAVING RECTIFIER MEANS CONNECTED BETWEEN ITS GATE AND SOURCE OR DRAIN ELECTRODES

John O. Schroeder, Trenton, N.J., assignor to Radio Corporation of America, a corporation of Delaware Filed June 19, 1963, Ser. No. 288,945
16 Claims. (Cl. 307—88.5)

This invention relates to electronic switching circuits, and more particularly to electronic switching circuits using semiconductor devices permissive of bidirectional current flow.

Bidirectionally conductive switching circuits have many useful applications in the electronics art, such as, for example, in synchronous detector circuits, signal gating circuits and in similar circuits where it is desirable to permit current flow in either direction through the switch when the switch is closed. Circuits have heretofore been proposed wherein a junction transistor is used as a bidirectionally conductive switching element with the desired signal information applied in series with the emitter-collector electrodes of the transistor and a switching voltage applied to the base electrode. One problem which has been encountered in such circuits is the contamination of the desired signal information by the switching voltage. The contamination includes a direct current (D.-C.) component developed across the base-emitter junction and an alternating current (A.-C.) component caused by switching currents flowing through the signal input and/or output circuits. Another problem encountered in switching circuits using junction transistors is that the range of desired signal amplitude for which the device exhibits linear characteristics is limited to a very small voltage.

It is an object of this invention to provide an improved electronic switching circuit.

Another object of this invention is to provide an improved synchronous detector circuit using a bidirectionally conductive semiconductor device in which a desired message signal may be derived from a received transmission without contamination by the switching or sampling signal.

A switching circuit embodying the invention includes signal input and output circuits coupled between the drain and source electrodes of an insulated-gate field-effect transistor. A source of switching signals and a rectifier are coupled betwen the gate and source electrodes of the transistor. The rectifier is poled to conduct on the excursions of the switching signal which are in a polarity direction which tends to render the transistor conductive. Where the switching signal source is capacitively coupled to the transistor and the rectifier is connected between the gate and source electrodes, the conduction of the rectifier charges the coupling capacitor to a voltage which maintains the transistor cut-off except during the interval of maximum switching signal voltage in the turn-on direction. Where the switching circuit is directly coupled to the transistor, the conduction of the rectifier clamps the gate-to-source voltage to a fixed level during the turn-on time to provide improved circuit linearity.

In the case of a synchronous detector, or product detector, a source of signal waves to be demodulated and an output circuit are coupled between the source and drain electrodes, and a carrier wave is applied as a switching signal to the gate electrode of an insulated-gate field-effect transistor. By properly phasing the carrier wave relative to the applied signal wave, the desired modulating signal information can be derived from the output circuit. Since no polarizing or B+ voltage supply is required, there is no problem with supply voltage drift in the circuit. Furthermore, since the input resistance of an insulated-gate field-effect transistor is extremely high, substantially no current due to the carrier flows in the signal input or output circuits to produce contamination of the demodulated signal.

The novel features which are considered characteristic of the invention are set forth with particularity in the appended claims. The invention itself, however, both as to its organization and method of operation as well as additional objects and advantages thereof will best be understood from the accompanying drawings in which:

Figures 4, 5, 6, 7, 8:
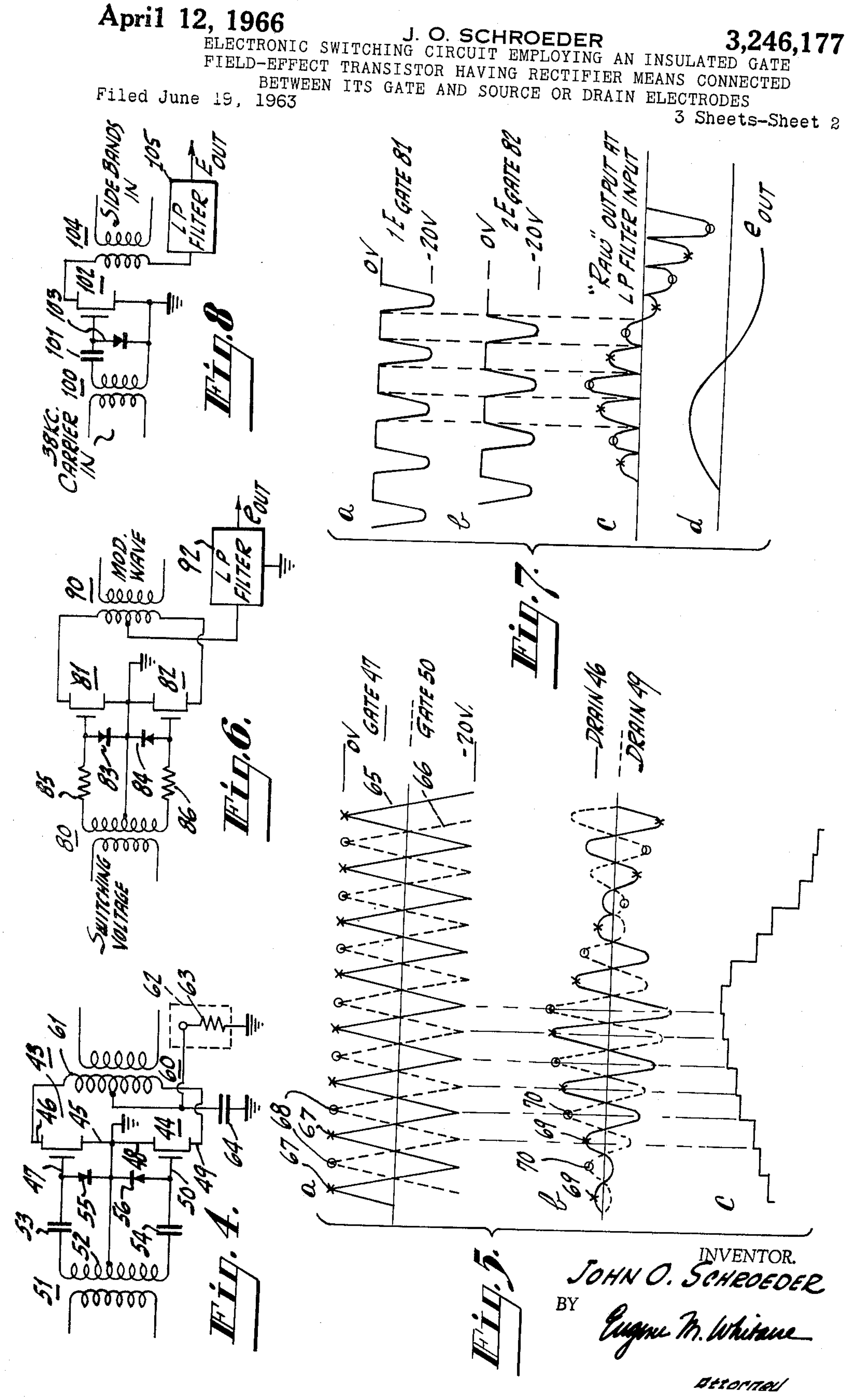
FIGURE 4 is a schematic circuit diagram of a balanced synchronous detector circuit embodying the invention.
Figure 10:
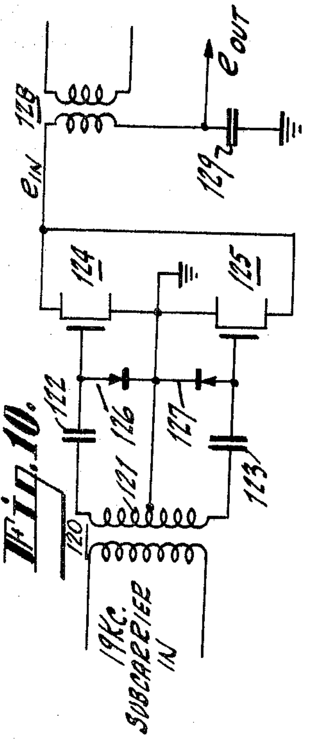
Figure 12:
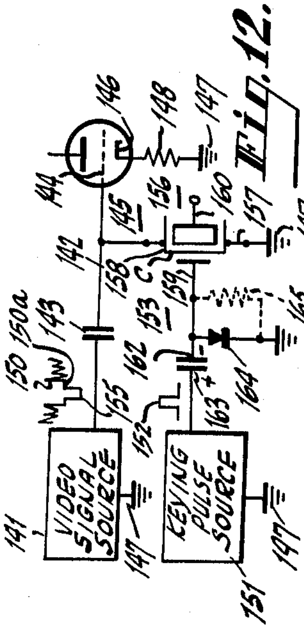
Figure 13:
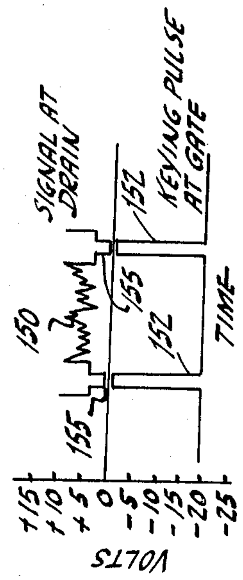
Figure 9:
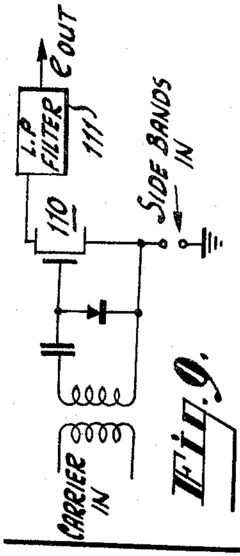
Figure 11:
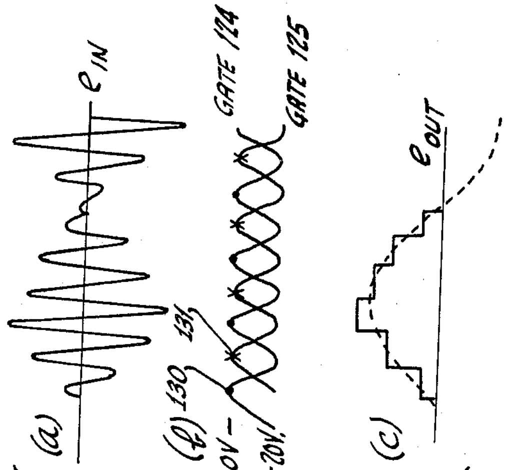

FIGURES 5*a*, 5*b* and 5*c* are graphs of voltage waveforms on the same time base, useful in explaining the operation of the synchronous detector circuit of FIGURE 4;

FIGURE 6 is a schematic circuit diagram of another balanced synchronous detector circuit embodying the invention;

FIGURES 7*a*, 7*b*, 7*c* and 7*d* are graphs of voltage waveforms useful in explaining the operation of the synchronous detector circuit of FIGURE 6;

FIGURE 8 is a schematic circuit diagram of a single-ended synchronous detector circuit embodying the invention, with the switching voltage referenced with respect to ground;

FIGURE 9 is a schematic circuit diagram of a single-ended synchronous detector circuit embodying the invention, with the signals containing the desired modulation information referenced with respect to ground;

FIGURE 10 is a schematic circuit diagram of a sub-carrier wave detector circuit for FM stereophonic receivers;

FIGURES 11*a*, 11*b* and 11*c* are graphs of voltage waveforms useful in explaining the operation of the sub-carrier detector circuit of FIGURE 10;

FIGURE 12 is a schematic circuit diagram of a clamp circuit embodying the invention; and FIGURE 13 is a graph of voltage waveforms useful in explaining the clamp circuit of FIGURE 12.

Figure 1:
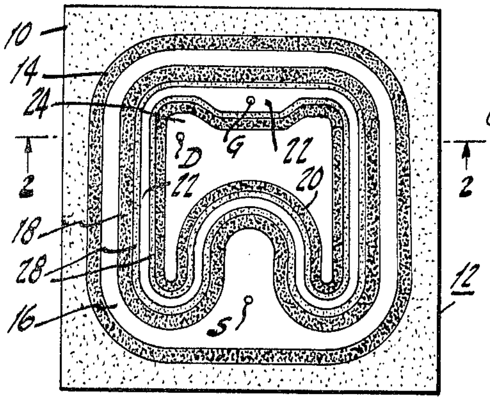
FIGURE 1 is a diagrammatic view of a field-effect transistor suitable for use in circuits embodying the invention.

Referring now to the drawings and particularly to FIGURE 1, a field-effect transistor 10 which may be used with circuits embodying the invention includes a body 12 of semiconductor material. The body 12 may be either a single crystal or polycrystalline and may be of any of the semiconductor materials used to prepare transistors in the semiconductor art. For example, the body 12 may be nearly intrinsic silicon, such as for example, lightly doped P-type silicon of 100 ohm cm. material.

In the manufacture of a device shown in FIGURE 1, heavily doped silicon dioxide is deposited over the surface of the silicon body 12. The silicon dioxide is doped with N-type impurities. By means of a photo-resist and acid etching, or other suitable technique, the silicon dioxide is removed where the gate electrode is to be formed, and around the outer edges of the silicon wafer as viewed on FIGURE 1. The deposited silicon dioxide is left over those areas where the source-drain regions are to be formed.

Figure 2:
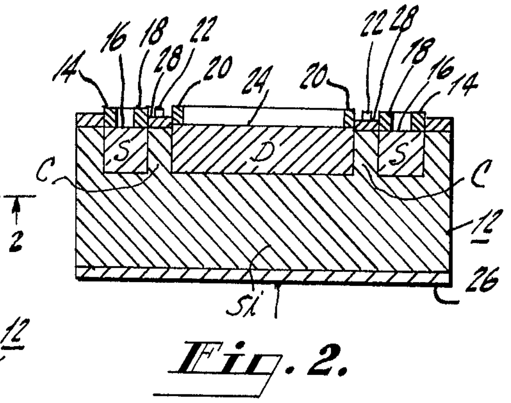
FIGURE 2 is a cross-sectional view taken along section line 2—2 of FIGURE 1.

The body 12 is then heated in a suitable atmosphere such as in water vapor so that exposed silicon areas are oxidized to form grown silicon dioxide layers indicated by the stippled areas of FIGURE 1. During the heating process, impurities from the deposited silicon dioxide layer diffuse into silicon body 12 to form the source and drain regions. FIGURE 2, which is a cross-section view taken along section line 2—2 of FIGURE 1, shows the source-drain regions labelled S and D respectively.

By means of another photo-resist and acid etching or like step, the deposited silicon dioxide over part of the source-drain diffused regions are removed. Electrodes are formed for the source, drain and gate regions by evaporation of a conductive material by means of an evaporation mask. The conductive materials evaporated are chromium and gold in the order named, but other suitable electrically conductive material may be used.

The finished wafer is shown in FIGURE 1, in which the stippled area between the outside boundary and the first more darkly stippled zone 14 is grown silicon dioxide. The white area 16 is the metal electrode corresponding to the source electrode. Dark zones 14 and 18 are deposited silicon dioxide zones overlying the diffused source region, and the dark zone 20 is a deposited silicon dioxide zone overlying the diffused drain region. White areas 22 and 24 are the metallic electrodes which correspond to the gate and drain electrodes respectively. The stippled zone 28 is a layer of grown silicon dioxide on a portion of which the gate electrode 22 is placed and which insulates the gate electrode 22 from the substrate silicon body 12 and from the source and drain electrodes as shown in FIGURE 2. The input resistance of the device at low frequencies is of the order of $10^{14}$ ohms.

The layer of grown silicon dioxide 28 on which the gate electrode 22 is mounted, overlies an inversion layer or channel C of controllable conductivity connecting the source and drain regions. The gate electrode 22 is displaced symmetrically between the source region S and the drain region D. If desired, the gate electrode 22 may be displaced towards the source region S and may overlap the deposited silicon dioxide layer 18.

It should be noted that electrodes D and S interchangeably operate as the drain and the source electrodes as a function of the polarity of the bias potential applied therebetween; i.e., the electrode to which a positive bias potential is applied (relative to the bias potential applied to the other electrode) operates as a drain electrode. The conduction of current through the channel C is by majority current carriers, in the present case electrons. If the device has an N-type substrate, and P-type source and drain regions, the majority current carriers are holes, and the electrode to which the negative terminal of a supply source is applied operates as the drain electrode.

Figure 3:
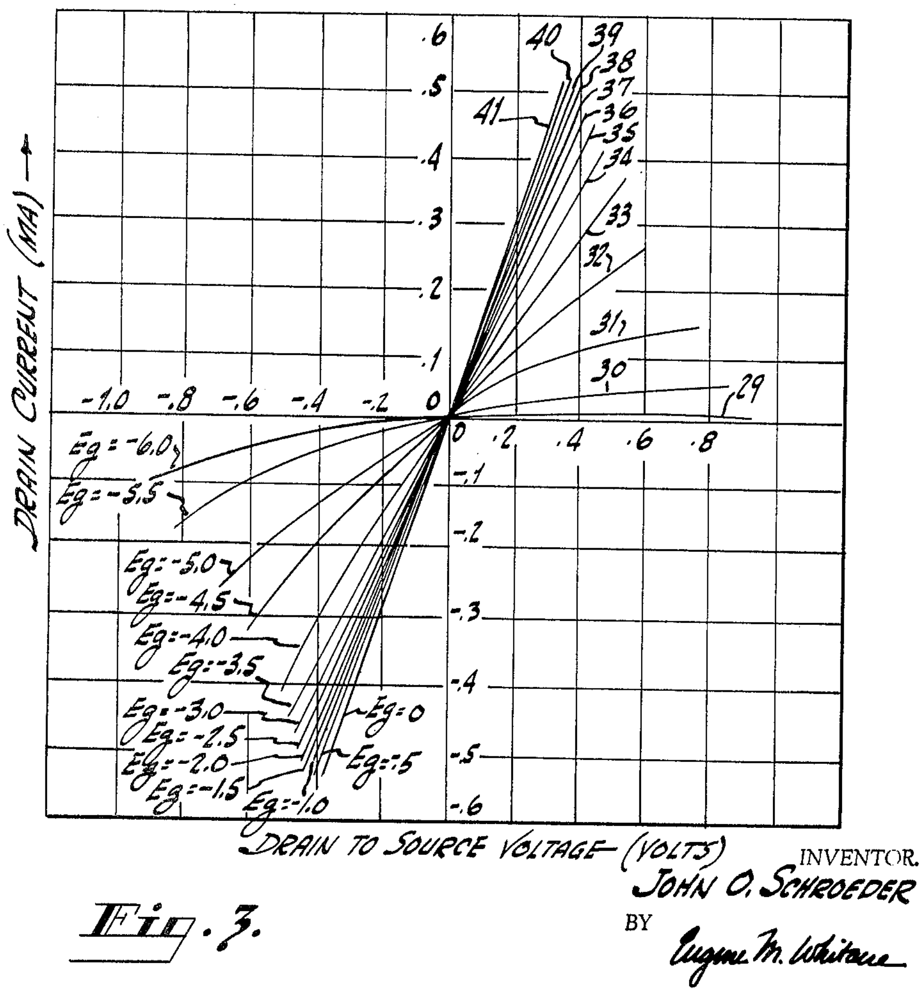
FIGURE 3 is a graph showing a family of drain current versus drain-to-source voltage curves for various values of gate-to-source voltages for the transistor of FIGURES 1 and 2.

The channel C, i.e., the source-to-drain current path, has controllable conductivity as shown by FIGURE 3 of the drawings. The conductivity of the channel C is a function of the amplitude and polarity of the gate-to-source bias voltage applied. FIGURE 3 is a family of curves 29–41 illustrating the linear portion below the knee of the drain current versus drain voltage characteristic of the insulated-gate field-effect transistor shown in FIGURE 1 connected in a common source configuration.

In order to more easily explain the conditions for obtaining the curves shown in FIGURE 3, one of the two electrodes will always be referred to as the drain electrode regardless of the polarity of the bias voltage applied thereto, and the other electrode will be referred to as the source electrode. The curves 29–41 shown in the first quadrant in FIGURE 3 were obtained by applying a bias potential to the drain electrode which is positive with respect to the potential of the source electrode, and by biasing the gate electrode with respect to the source electrode by a voltage having a magnitude as indicated by the voltage of $E_g$ (gate voltage) corresponding to each of the curves 29–41. The portion of the curves 29–41 corresponding to the third quadrant were obtained by reversing the polarity of the bias voltage applied between the source and drain electrodes, i.e., by applying a bias potential to the drain electrode which is negative with respect to the potential of the source electrode.

It should be noted that the drain current versus drain voltage characteristics shown in FIGURE 3 is substantially linear over a substantial range of drain voltages as compared to a bipolar or junction transistor. With a gate-to-source voltage corresponding to the curve 29, substantially no source-to-drain current flows, while a gate-to-source voltage corresponding to the curve 41, permits source-to-drain current as a linear function of applied source-to-drain voltage.

A feature of an insulated-gate field-effect transistor is that it can be manufactured so that the zero gate bias voltage characteristic is at any one of the curves shown in FIGURE 3. In FIGURE 3, for example, the curve 41 corresponds to the zero bias voltage curve, as indicated by the notation $E_g=0$. The location of the zero bias curve is established during the manufacture of the transistor, e.g., by controlling the time and/or temperature of the step of the process when the silicon dioxide layer 28 shown in FIGURES 1 and 2 is grown. The longer the transistor is baked and the higher the temperature, in a dry oxygen atmosphere, the larger the drain current will be for a given amount of drain voltage at zero bias between the source and gate electrodes. Hence, if desired, the curve 29 could be made to correspond to the zero gate bias condition, with the curves 30—41 corresponding to progressively more positive gate voltages.

Reference is now made to FIGURE 4 which is a schematic circuit diagram of a balanced synchronous detector circuit employing a pair of insulated-gate field-effect transistors 43 and 44 which may be similar to the transistor described with reference to FIGURES 1 and 2. The transistor 43 has a source electrode 45, a drain electrode 46, and a gate electrode 47, and the transistor 44 has a source electrode 48, a drain electrode 49, and a gate electrode 50.

Switching signals from a source, not shown, are coupled through a transformer 51 having a centertapped secondary winding 52. The opposite ends of the secondary winding 52 are coupled to the gate electrodes 47 and 50 through the coupling capacitors 53 and 54 respectively. The centertap of the secondary winding 52 is connected to the source electrodes 45 and 48 which are at ground potential.

A first rectifier 55 is connected between the gate electrode 47 and the source electrode 45 of the transistor 43 and a second rectifier 56 is connected between the gate electrode 50 and the source electrode 48 of the transistor 44. The poling of the rectifiers 55 and 56 is such that they are respectively rendered conductive for signal excursions tending to drive the respective gate electrodes 47 and 50 positive relative to ground, which is the polarity direction tending to increase the source-drain current in the transistors 43 and 44.

Signal modulated waves from a source, not shown, are coupled to a transformer 60 which has a centertapped secondary winding 61. The secondary winding 61 is connected between the drain electrodes 46 and 49 respectively, and the centertap is connected to a utilization or load circuit 62 having an internal resistance represented by a resistor 63. The capacitor 64 which is connected between the centertap of the secondary winding 61 and ground serves as a storage capacitor. It is not necessary to have a completed direct current path between the source and drain electrodes of the transistors 43 and 44, and hence signals may be capacitively coupled to the load circuit 62.

The circuit of FIGURE 4 may be used, by way of example, as a subcarrier detector for stereophonic FM receivers. Such a subcarrier wave is a double-sideband amplitude-modulated suppressed carrier wave at 38 kc., which is transmitted together with a 19 kc. (half carrier frequency) pilot signal for use in demodulation.

The subcarrier sidebands are applied to the primary winding of the transformer 60, and the pilot signal which has been doubled in frequency by suitable circuitry, as is known in the art, is applied to the primary winding of the transformer 51.

The frequency doubled pilot signal will be referred to as the switching or sampling signal, and is shown in the graphs of FIGURE *5a*. The solid line waveform 65 is intended to represent the sinusoidal switching waveform as measured between the gate electrode 47 and ground. The dashed line waveform 66 is intended to represent the sinusoidal wave as measured between the gate electrode 50 and ground. As the switching signal drives the gate electrode 47 positive, the diode 55 conducts charging the capacitor 53 to a voltage which builds up to a value approximating the peak level of the switching voltage 65. The diode 55 conducts only at the peaks of the switching signal as indicated by the "X's" 67. During the interval between switching signal positive voltage peaks, the charge on the capacitor 53 is of a polarity to hold the gate 47 negative, and is of sufficient amplitude to maintain the transistor 43 cutoff. The transistor 44 operates in a manner similar to the transistor 43 but is rendered conductive at the peaks represented by the "O's" 68 as shown in FIGURE *5a*.

FIGURE *5b* is a graph showing the sideband envelope of the signals applied to the drain electrodes 46 and 49. The "X's" 69 and "O's" 70 on the waveform indicate the times when the source-to-drain resistance of the transistors 43 and 44 respectively is very low. During the remainder of each cycle the transistor will be completely cutoff by the high negative bias. It will be noted that the sideband envelope is sampled at a 76 kc. sampling rate due to the push-pull sampling technique. The storage capacitor 64, is charged to the instantaneous sideband voltage at the times indicated by the "X's" and "O's" of FIGURE *5b*. The output voltage across capacitor 64 is a many step approximation of the modulating signal as shown in FIGURE *5c*. The lowest "spurious" output frequency, being 76 kc., is easily removed by a simple low-pass filter, since the amplitude of this spurious output frequency is always smaller than the desired audio output signal.

The product detector circuit of FIGURE 4 provides excellent operational characteristics in that a modulated signal is efficiently demodulated without contamination in a relatively simple circuit. No direct voltage polarizing supply is required, and hence D.-C. stability problems associated with supply voltage drift, device aging, and the like are not encountered. Furthermore, the impedance between the gate electrode and the source or drain electrodes of the transistors is so high that substantially no current from the switching signal source flows in the input or output circuit to contaminate the desired signal. Still further, since no rectifying junction exists between the gate and source or drain electrodes, as there is in junction transistors, there is no undesirable temperature responsive offset voltage which would otherwise appear across the output circuit and contaminate the desired signal. Another advantage of the described circuit is that linear operation is maintained over a range of relatively large signal voltages applied between the source and drain electrodes as compared to junction transistor circuits.

The circuit shown in FIGURE 4 operates as a peak or narrow phase angle sampling detector. With modification, the circuit can function as an average detector employing 180° sampling as shown in FIGURE 6. In the circuit of FIGURE 6 the switching signal is applied through a transformer 80 to the gate electrodes of a pair of transistors 81 and 82. A rectifier 83 is connected between the gate and source electrodes of the transistor 81, and a rectifier 84 is connected between the gate and source electrodes of the transistor 82. A pair of current limiting resistors 85 and 86 respectively, connect the gate electrodes of the transistors 81 and 82 to the opposite ends of the centertapped secondary winding of the transformer 80.

The signal modulated waves, from a source not shown, are applied through a transformer 90 the secondary winding of which is connected between the drain electrodes of the transistors 81 and 82. The drain current of the transistors 81 and 82 is derived from a centertap on the secondary winding of the transformer 90, and passes through a low-pass filter 92 to remove higher order components from the demodulated signal.

The action of the resistors 85 and 86 and the diodes 83 and 84 causes the gate electrodes of the transistors 81 and 82 to be clamped at ground potential for half of each input cycle and then go heavily negative for the other half cycle. This results in the voltage waveform at the gate electrodes of transistors 81 and 82 respectively shown in the graphs of FIGURES *7a* and *7b*. The rectification of the positive portion of the voltage waveform insures that the variation in transconductance (gm.) caused by the sinusoidally varying gate voltage will not add distortion to the demodulated output signal.

The drain current of the transistors 81 and 82 as measured between the centertap on the secondary winding of the transformer 90 and ground, is shown in the graph of FIGURE *7c*. The drain current of the transistor 81 is represented as half cycles denoted by "X" and the drain current of the transistor 82 is shown as those half cycles denoted by "O." A low-pass filter 92 removes the high frequency components and provides the original pure modulating information which is shown in FIGURE *7d*. It will be noted that the sampling occurs at twice the switching voltage rate, and the transistors 81 and 82 sequentially sample for 180° of the switching voltage cycle. Considered from an overall standpoint, the detector of FIGURE 6 affords full 360° sampling and provides high performance characterized by good signal-to-noise ratio (noise immunity) and freedom from distortion and intermodulation effects. In addition, the advantages with respect to D.-C. stability and lack of desired signal contamination are also present in the circuit of FIGURE 6.

The circuits shown in FIGURES 4 and 6 can also be used in the "single-ended" form as shown in FIGURE 8. In the circuit of FIGURE 8 the switching signals from a source, not shown, are coupled through a transformer 100 and a coupling capacitor 101 between the gate and source electrodes of the transformer 102. A diode 103 is directly coupled between the gate and source electrode of the transistor 102. The diode 103 is poled for conduction when the polarity excursion of the switching signal is in a direction to turn-on the transistor 102.

Signal modulated waves from a source, not shown, are coupled through a transformer 104, the secondary winding of which is connected in series with a low-pass filter 105 between the collector of the transistor 102 and ground.

Due to the action of the capacitor 101 and the rectifier 103, the circuit of FIGURE 8 operates as a single-ended peak or narrow angle synchronous detector. Where the detector circuit is used for demodulating an FM subcarrier wave, sampling occurs at a 38 kc. rate since the transistor 102 is rendered conductive once for each cycle of the switching signal.

FIGURE 9 shows a modification of the circuit of FIGURE 8 wherein the signal modulated waves are coupled between the source electrode of the transistor 110 and ground, and the demodulated signal waves are derived from a low-pass filter 111 connected to the drain electrode of the transistor 110. Otherwise the circuit is similar to that shown in FIGURE 8 and operates as a single-ended peak or narrow angle synchronous detector circuit.

The circuit shown in FIGURE 10 is a subcarrier wave detector for FM stereophonic receivers. A received 19 kc. pilot wave is separated from the remainder of the composite FM signal and applied without doubling to the primary winding of transformer 120 having a centertapped secondary winding 121. The opposite ends of the secondary winding 121 are coupled respectively through capacitors 122 and 123 to the gate electrodes of a pair of transistors 124 and 125. A rectifier 126 is coupled between the gate and source electrodes of transistor 124 and the rectifier 127 is coupled between the gate and source electrodes of the transistor 125. The centertap of the secondary winding 121 and the source electrodes of the transistors 124 and 125 are grounded.

The subcarrier sideband energy representative of the difference between the stereophonic signals to be reproduced is coupled to the primary winding of a transformer 128. One terminal of the secondary winding of the transformer 128 is coupled in common to the drain electrode of the transistors 124 and 125, and the other terminal of the secondary winding is coupled to storage capacitor 129 across which the output signal is derived.

The subcarrier sideband energy applied through the transformer 128 is represented by the graph shown in FIGURE 11*a*. The 19 kc. switching signal as measured between the gate electrode of the transistor 124 and ground is shown by the curve 130 of FIGURE 11*b*, and the curve 131 represents the switching waveform as measured between the gate of the transistor 125 and ground. Since the 19 kc. pilot signal is fed in push-pull relation to the gates of the transistor 124 and 125, and the 38 kc. sideband signal is applied in parallel to the drains the sideband envelope is sampled at a 38 kc. rate, and the samples as stored by the capacitor 129, result in the waveform shown in FIGURE 11*c*. With a detector of the type shown in FIGURE 10, it is unnecessary to derive a stable source of 38 kc. subcarrier from the 19 kc. pilot signal to provide the desired 38 kc. sampling rate.

Reference is now made to FIGURE 12 which is a schematic circuit diagram of a keying or clamp circuit, including an insulated-gate field-effect transistor 140 similar to the one described in connection with FIGURES 1 and 2, as applied to a high-impedance signal translating system. In this system, the signal output side of a source of video signals 141 is coupled through a capacitor 143 and a circuit lead 142 to an input electrode 144 of a subsequent stage 145. This may be an electronic-tube amplifier having a cathode 146 connected to system ground 147 through a suitable bias resistor 148. The stage 145 may represent a stage of a television receiver, for which it is desirable or requisite that the applied video signal contain the proper D.-C. and/or low-frequency components. The video signal wave 150 appearing at the output circuit of the source 141 has periodically recurring control periods such as the blanking intervals **150*a*, during which occur periodic reference and control signals 155**.

In the present example, a source 151 supplies periodically-recurring keying pulses 152 to key into operation, during a selected portion of each control period, a clamp or control circuit 153 for adjusting the charge on the coupling capacitor 143 whereby the circuit lead 142 or the grid 144 of the stage 145 may be brought to a predetermined potential or clamping level which is the same during each control period. The keying pulses 152 are timed to coincide with recurrent portions of the video signal and, in the present example, are timed to occur during pulse peaks 155 of the video signal 150.

The clamp circuit 153 includes an insulated-gate field-effect transistor 156 similar to the one described in FIGURES 1 and 2. The transistor 156 has a source electrode 157, a drain electrode 158, a gate electrode 159 and a substrate of semiconductor material with an electrode 160. The source electrode 157 is connected to a point of reference potential shown as system ground 147 in the present example. The drain electrode 158 is connected to the video signal translating channel at the circuit lead 142 which, as indicated, may be part of the input grid circuit of a video or like signal amplifier.

The source of video input signals 141 is thus effectively connected across the channel C of controllable conductivity or resistance between the source electrode 157 and the drain electrode 158. This internal source-to-drain path exhibits a resistance that is a function of the gate-to-source bias voltage and is effectively maximum or minimum or off-and-on, in response to relatively high keying pulse peaks such as the peaks 152.

The keying or control-pulse voltage source 151 is connected between the gate electrode 159 and system ground 147 as shown, through a supply lead 162 and a coupling capacitor 163 therein. A diode 164 is connected from the gate electrode 159, or the pulse circuit lead 162, to system ground 147 and is poled to conduct to ground on positive pulse peaks 152 at the gate, and sets the keying pulse tips at ground and the base at a negative value. See FIGURE 13, for example. The coupling capacitor 163 in the pulse circuit is charged on positive-going pulse peaks by current through the diode. The charge leaks off slowly through the back-resistance of the diode as indicated in dotted outline at 165. The time constant of the resistance means 165 and the capacitor 163 in combination, is such that the gate is biased sufficiently negatively during the interval between the keying pulses to maintain the transistor 156 cutoff.

Thus, during each recurrent peak interval 155 of the video signal 150, the normally-open or highly resistive current path C of the transistor 156 is rendered conductive and reduced to a relatively low resistance by the action of the keying pulse 152. Current may then flow therethrough in either direction, the direction of flow depending upon the polarity of the potential difference between the signal level at the circuit lead 142 or the grid 144 and the reference potential or clamping level voltage, which is ground potential in the present example.

Due to the high resistance between the gate electrode 159 and either of the source and drain electrodes 157 and 158, substantially none of the keying pulse current flows in the video signal circuit. Accordingly the video signal is not contaminated by or subject to a pedestal level effect due to the keying pulses.

Although the circuits of the various figures have been described in connection with an insulated-gate field-effect transistor having a P-type semiconductor substrate, other types of insulated-gate devices may be used. For example, a complementary conductivity type device having an N-type semiconductor substrate may be used. Alternatively, other types of insulated-gate devices may also be used such as thin film devices formed on an insulating support.

What is claimed is:

1. An electronic switching system for controlling bidirectional currents including an insulated-gate field-effect transistor having source, gate and drain electrodes,
   - a control circuit including rectifying means connected between said gate electrode and one of said source and drain electrodes,
   - a controlled circuit including a source of bidirectional currents and a load impedance element connected between said source and drain electrodes, and
   - means for applying switching signals to said control circuit.

2. An electronic switching system for controlling bidirectional currents comprising,
   - an insulated-gate field-effect transistor having source, gate and drain electrodes,
   - means providing a source of switching signals coupled between said gate and source electrodes,
   - a rectifier coupled between said gate and source electrodes, and poled to provide a low impedance path for signals of a polarity tending to decrease the source-drain path resistance of said transistor, and
   - a source of controlled signals coupled between said source and drain electrodes.

3. An electronic switching system for controlling bidirectional currents comprising,
   - an insulated-gate field-effect transistor having source, gate and drain electrodes,
   - means providing a source of switching signals, a capacitor coupling said source of switching signals to said gate electrode, a rectifier coupled between said gate electrode and said source electrode and across said source of switching signals, said rectifier poled to provide a low impedance path for signals of a polarity tending to decrease the source-drain path resistance of said transistor, and a source of controlled signals coupled between said source and drain electrodes.

4. An electronic switching system for controlling bidirectional currents comprising, an insulated-gate field-effect transistor having source, gate and drain electrodes, means providing a source of switching signals coupled between said gate and source electrodes, a resistor coupling said switching signals to said gate electrode, a rectifier coupled between said gate electrode and said source electrode and across said source of switching signals, said rectifier poled to provide a low impedance path for signals of a polarity tending to decrease the source-drain path resistance of said transistor, and a source of controlled signals coupled between said source and drain electrodes.

5. A product detector comprising, an insulated-gate field-effect transistor having source, gate and drain electrodes, means providing a source of switching signals coupled between said gate and source electrodes, a capacitor coupling said source of switching signals between said gate electrode and a point of reference potential, a rectifier coupled between said gate electrode and said point of reference potential, means connecting said source electrode to said point of reference potential, means providing a source of modulated wave energy to be detected, and a low-pass filter connected in series with said source of modulated wave energy between said source and drain electrodes.

6. A product detector comprising, an insulated-gate field-effect transistor having source, gate and drain electrodes, means providing a source of switching signals coupled between said gate and source electrodes, a capacitor coupling said source of switching signals between said gate electrode and said source electrode, a rectifier connected between said gate and source electrodes, said rectifier poled to provide a low impedance path for signals of a polarity tending to decrease the source-drain path resistance of said transistor, means providing a source of modulated wave energy to be detected coupled between said source electrode and a point of reference potential, and a low-pass filter coupled between said collector electrode and said point of reference potential.

7. A product detector comprising, a pair of insulated-gate field-effect transistors each having gate, source and drain electrodes, means providing a source of switching signals coupled in push-pull relation between the gate electrodes of said transistors, and means providing a source of modulated wave energy to be detected coupled between the drain and source electrodes of said pair of transistors.

8. A product detector comprising, a pair of insulated-gate field-effect transistors each having gate, source and drain electrodes, means providing a source of switching signals coupled in push-pull relation between the gate electrodes of said transistors, means providing a source of modulated wave energy to be detected, coupled in push-pull relation between the drain electrodes of said pair of transistors, and means connecting said source electrodes to a point of reference potential relative to said source of switching signals and source of modulated wave energy to be detected.

9. A product detector comprising, a pair of insulated-gate field-effect transistors each having gate, source and drain electrodes, means providing a source of switching signals coupled to a first transformer including a centertapped secondary winding, a pair of capacitors coupling opposite ends of said secondary winding respectively to the gate electrodes of said pair of transistors, a pair of rectifiers connected respectively between the gate and source electrodes of said pair of rectifiers, said rectifiers poled to provide a low impedance path for signals of a polarity tending to decrease the source-drain path resistance of said transistors, means connecting the centertap of the secondary winding of said first transformer to the source electrodes of said pair of transistors, means providing a source of modulated wave energy to be detected coupled to a second transformer having a centertapped secondary winding, means connecting the secondary winding of said second transformer between the drain electrodes of said pair of transistors, and output circuit means coupled between the centertap of the first transformer secondary winding and the source electrodes of said pair of transistors.

10. A product detector comprising, a pair of insulated-gate field-effect transistors each having gate, source and drain electrodes, means providing a source of switching signals coupled to a first transformer including a centertapped secondary winding, a pair of resistors coupling opposite ends of said secondary winding to the gate electrodes of said pair of transistors, a pair of rectifiers connected respectively between the gate and source electrodes of said pair of rectifiers, said rectifiers poled to provide a low impedance path for signals of a polarity tending to decrease the source-drain path resistance of said transistors, means connecting the centertap of the secondary winding of said first transformer to the source electrodes of said pair of transistors, means providing a source of modulated wave energy to be detected coupled to a second transformer having a centertapped secondary winding, means connecting the secondary winding of said second transformer between the drain electrodes of said pair of transistors, and output circuit means coupled between the centertap of the first transformer secondary winding and the source electrodes of said pair of transistors.

11. Apparatus comprising the combination of an insulated-gate field-effect transistor having gate, source and drain electrodes, means capacitively coupled between said gate and source electrodes for switching the source-drain path of said transistor between a conducting and a nonconducting condition, a rectifier directly coupled between said gate and source electrodes and poled for conduction in response to signals of a polarity tending to switch the source-drain path of said transistor to said conducting condition, a load, an energy source, a current path between said load and said source, and means for utilizing said source-drain path as a bidirectional current supporting circuit element closing said current path when in a conducting condition and opening said path when in a non-conducting condition.

12. Apparatus comprising the combination of an insulated-gate field-effect transistor having gate, source and drain electrodes, biasing means including a rectifier connected between said gate electrode and one of said source and drain electrodes for establishing the source-to-drain path of said transistor at a first condition of conductivity, switching means coupled to said biasing means for providing a signal of a polarity and amplitude to change the source-to-drain path of said transistor to a second condition of conductivity, means providing a source of signals and a load impedance element connected in series with the source-drain path of said transistor, one of said first and second conditions of conductivity corresponding to a cutoff condition of said source-to-drain path, and the other of said conditions of conductivity corresponding to a relatively highly conducting condition between said source and drain electrodes.

13. Apparatus comprising the combination of an insulated-gate field-effect semiconductor device having an input electrode, an output electrode and a common electrode, a load circuit connected between said output electrode and said common electrode, a control circuit including a rectifier coupled between said input electrode and said common electrode, means coupled to said control circuit for controlling the opening and closing of said load circuit, said load circuit including alternating current supply means whereby the direction of current flow between said common and output electrodes is a function of the instantaneous direction of said alternating current during the interval when said load circuit is closed.

14. The combination with a high frequency signal translating circuit for composite signals, including periodic signal peaks, of a coupling capacitor in said circuit and a source of clamping voltage for said circuit, an insulated-gate field-effect semiconductor device having a current conductive path connected between the output side of said coupling capacitor and said source of clamping voltage, said semiconductor device having gate, source and drain electrodes on a substrate of semiconductor material with said current conductive path between said source and drain electrodes, a keying pulse supply circuit, a capacitor coupling said supply circuit to said gate electrode, and means including a diode rectifier providing a direct-current conductive connection between said gate electrode and the source electrode, whereby the signal translating circuit is clamped in response to keying pulses applied to said gate electrode.

15. In a circuit for correction of a signal supplied from a source and having recurrent control periods, the combination including, utilization means for said corrected signal, a first capacitor connected between said source and said utilization means, an insulated-gate field-effect transistor having source, drain and gate electrodes on a substrate of semiconductor material, a charging and discharging circuit for said capacitor, said circuit being connected between said utilization means and a point of reference potential for said circuit and including the internal drain-source path of said transistor, said drain-source path completing a charging circuit for said capacitor when the potential difference between the potential of said utilization means and said reference potential is of one polarity during a control period portion, and said drain-source path completing a discharging circuit for said capacitor when said potential difference is of the opposite polarity to said one polarity during a control period portion, means providing a source of keying signals coupled through a second capacitor to said gate electrode for rendering said drain-source path conductive during at least a portion of each of said control periods, and rectifier means coupled between said gate electrode and said point of reference potential, said rectifier poled to conduct current in response to said keying signals.

16. In a video signal translating system wherein a first capacitor couples an output terminal of one stage of said system to an input terminal of subsequent stage thereof in a manner that periodic synchronizing signal excursions are in the negative direction, a keyed clamping circuit comprising, an insulated-gate field-effect transistor having source, gate and drain electrodes on a substrate of P-type semiconductor material, means for connecting one of said source and drain electrodes to said input terminal, means for connecting the other of said source and drain electrodes to a point of reference potential, a source of keying pulses timed to occur during the interval of said synchronizing signal excursions, means including a second capacitor coupled between said source of keying pulses and gate electrode for applying said keying pulses to said gate electrode in such a polarity as to periodically render the source-to-drain current path of said transistor conductive, and rectifier means connected between said gate electrode and said point of reference potential for clamping the peaks of said keying signal at said reference potential, the time constant of said second capacitor and the back resistance of said rectifier being long compared to the interval between said keying pulses.

References Cited by the Examiner

UNITED STATES PATENTS

| | | | |
|---|---|---|---|
| 2,825,822 | 3/1958 | Huang | 307—88.5 |
| 2,907,932 | 10/1959 | Patchell | 329—103 X |
| 3,003,122 | 10/1961 | Gerhard | 329—101 X |
| 3,042,872 | 7/1962 | Brahm | 329—50 |

ARTHUR GAUSS, *Primary Examiner.*

I. C. EDELL, *Assistant Examiner.*